United States Patent
Strong et al.

(10) Patent No.: US 10,591,952 B1
(45) Date of Patent: Mar. 17, 2020

(54) CLOCK DISTRIBUTION RESONATOR SYSTEM

(71) Applicants: Joshua A. Strong, Ellicott City, MD (US); Max E. Nielsen, Odenton, MD (US); Vladimir V. Talanov, Ellicott City, MD (US); Temitope Olumuyiwa Ogunnika, Elkridge, MD (US)

(72) Inventors: Joshua A. Strong, Ellicott City, MD (US); Max E. Nielsen, Odenton, MD (US); Vladimir V. Talanov, Ellicott City, MD (US); Temitope Olumuyiwa Ogunnika, Elkridge, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/352,558

(22) Filed: Mar. 13, 2019

(51) Int. Cl.
  *G06F 1/10* (2006.01)
  *G06F 1/12* (2006.01)

(52) U.S. Cl.
  CPC . *G06F 1/10* (2013.01); *G06F 1/12* (2013.01)

(58) Field of Classification Search
  CPC .................................. G06F 1/10; G06F 1/12
  See application file for complete search history.

(56) References Cited

U.S. PATENT DOCUMENTS

| | | | |
|---|---|---|---|
| 5,990,721 A | 11/1999 | Mellitz | |
| 6,098,176 A * | 8/2000 | Coteus | G06F 1/10 |
| | | | 713/400 |
| 6,563,358 B1 | 5/2003 | Goulette | |
| 2007/0285179 A1 | 12/2007 | Ikeda et al. | |
| 2009/0146748 A1 | 6/2009 | Pernia et al. | |
| 2016/0125309 A1 | 5/2016 | Naaman et al. | |

OTHER PUBLICATIONS

Chi V L. "Salphasic Distribution of Clock Signals for Synchronous Systems", IEEE Transactions on Computers, IEEE Service Center, vol. 43, No. 5, May 1, 1994.
Korean Office Action for Application Serial No. 10-2017-7037126 dated May 29, 2019.

(Continued)

*Primary Examiner* — Jung Kim
(74) *Attorney, Agent, or Firm* — Tarolli, Sundheim, Covell & Tummino LLP

(57) ABSTRACT

One embodiment includes a clock distribution resonator system. The system includes a clock source configured to generate a clock signal having a predefined wavelength, and a main transmission line coupled to the clock source to propagate the clock signal and comprising a first predetermined length defined as a function of the wavelength of the clock signal. The system also includes a plurality of transmission line branches each coupled to the main transmission line to propagate the clock signal. Each of the plurality of transmission line branches includes a second predetermined length different from the first predetermined length. The system further includes a plurality of clock distribution networks coupled to the respective plurality of transmission line branches and being configured to provide the clock signal to each of a plurality of circuits to provide clock synchronization for the associated plurality of circuits.

21 Claims, 2 Drawing Sheets

(56) References Cited

OTHER PUBLICATIONS

European Examination Report corresponding to EP Patent Application No. 16 726 447.2-1206 dated Apr. 25, 2019.
Chi V L: "Salphasic Distribution of Clock Signals for Synchrc" IEEE Transactions on Computers, IEEE Service Center, Los AL vol. 43, No. 5, May 31, 1994 (May 31, 1994 ), pp. 597-602, XP000442053,ISSN: 0018-9340, DOI: 10.1109/12.280806.
Herr, Q. et al: "Ultra-Low-Power 1-20 Superconductor Logic," arxiv.org, Cornell University Library, 201 Olin Library Cornell University Ithaca, NY 14853, Mar. 22, 2011 (Mar. 22, 2011) the whole document.
International Search Report corresponding to International Application No. PCT/US2019/018396 dated Apr. 25, 2019.
Korean Office Action for Application No. 10-2017-7037126 dated Dec. 23, 2019.

* cited by examiner

CLOCK DISTRIBUTION RESONATOR SYSTEM

TECHNICAL FIELD

The present invention relates generally to computer systems, and specifically to a clock distribution resonator system.

BACKGROUND

Typical circuits that implement logic functions can operate based on a clock to synchronize data and/or provide a time-based flow of the logic functions. Circuits that are based on complementary metal-oxide-semiconductor (CMOS) technology can implement a clock to indicate when a given logic circuit or gate is to capture data at one or more inputs for processing or transferring the data to other logic functions. A given clock can thus provide a clock signal to a variety of devices in the circuit to provide the requisite timing information, and thus to substantially synchronize data transfer and timing functions. Other types of circuits can implement clock signals, such as reciprocal quantum logic (RQL) circuits. RQL circuits can implement timing information based on a clock that is provided, for example, as a sinusoidal signal having a substantially stable frequency.

SUMMARY

One embodiment includes a clock distribution resonator system. The system includes a clock source configured to generate a clock signal having a predefined wavelength, and a main transmission line coupled to the clock source to propagate the clock signal and comprising a first predetermined length defined as a function of the wavelength of the clock signal. The system also includes a plurality of transmission line branches each coupled to the main transmission line to propagate the clock signal. Each of the plurality of transmission line branches includes a second predetermined length different from the first predetermined length. The system further includes a plurality of clock distribution networks coupled to the respective plurality of transmission line branches and being configured to provide the clock signal to each of a plurality of circuits to provide clock synchronization for the associated plurality of circuits.

Another embodiment includes a clock distribution resonator system. The system includes a clock source configured to generate a sinusoidal clock signal having a predefined wavelength and a main transmission line coupled to the clock source to propagate the sinusoidal clock signal and comprising a length defined as an odd multiple of a quarter period of the predefined wavelength of the sinusoidal clock signal. The system also includes a plurality of transmission line branches each coupled to the main transmission line to propagate the sinusoidal clock signal. Each of the plurality of transmission line branches includes a length defined as a multiple of a half period of the predefined wavelength of the sinusoidal clock signal. The system further includes a plurality of clock distribution networks coupled to the respective plurality of transmission line branches and being configured to provide the sinusoidal clock signal to each of a plurality of circuits to provide clock synchronization for the associated plurality of circuits.

Another embodiment includes a clock distribution resonator system. The system includes a clock source configured to generate a sinusoidal clock signal having a predefined wavelength, and a main transmission line coupled to the clock source to propagate the sinusoidal clock signal and comprising a first predetermined length defined as a function of the wavelength of the sinusoidal clock signal. The system also includes a plurality of transmission line branches each coupled to the main transmission line to propagate the sinusoidal clock signal. Each of the plurality of transmission line branches includes a second predetermined length defined as a function of the wavelength of the sinusoidal clock signal. The second predetermined length can be different from the first predetermined length. The main transmission line and the plurality of transmission line branches can be arranged to have a total impedance between the clock source and each of the clock distribution network of approximately 50Ω or less. The system further includes a plurality of clock distribution networks coupled to the respective plurality of transmission line branches and being configured to provide the sinusoidal clock signal to each of a plurality of circuits to provide clock synchronization for the associated plurality of circuits.

DETAILED DESCRIPTION

Figure 1:
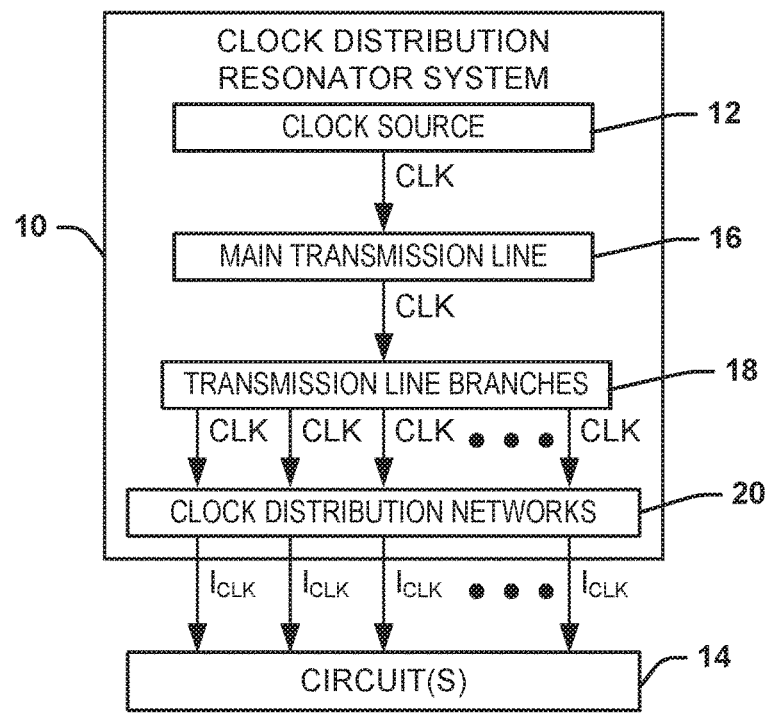
FIG. 1 illustrates an example diagram of a clock distribution resonator system.

The present invention relates generally to computer systems, and specifically to a clock distribution resonator system. The clock distribution resonator system can be implemented to distribute a clock signal, such as a sinusoidal clock signal, to a plurality of clock distribution networks that are configured to provide the clock signal to one or more respective separate circuits, such as associated with a single integrated circuit (IC) chip, across a plurality of IC chips, or across one or more printed circuit boards (PCBs). For example, the clock distribution networks can be arranged as dynamic zeroth-order resonators ("DynaZORs") that implement a resonator "spine" and "rib" configuration, such as described in U.S. application Ser. No. 15/816,518, which is incorporated herein by reference in its entirety. Therefore, each of the clock distribution networks can be implemented in a superconducting environment, such as to inductively couple the clock signal to the associated circuit(s). Accordingly, the clock distribution resonator system can provide the clock signal to a large number of circuits that are spatially separated, or a very large circuit, to facilitate synchronization of functions of the circuit(s), such as at very high speeds (e.g., ten or more GHz).

As an example, the clock distribution resonator system can include a clock generator to generate the clock signal, and can include a main transmission line that is configured to propagate the clock signal to a plurality of transmission line branches. For example, the main transmission line and the transmission line branches can be arranged as a dendritic network that can provide multiple splits of the clock signal to multiple transmission line branches along multiple layers of the dendritic network. The main transmission line can have a predetermined length that is associated with the predefined wavelength of the clock signal. For example, the main transmission line can have a length that is an odd multiple of a quarter period of the predefined wavelength λ of the clock signal (e.g., $\lambda/4$). Each of the transmission line branches that branch from the main transmission line can likewise have a predetermined length that is associated with the predefined wavelength of the clock signal, with the length of the transmission line branches being different from the length of the main transmission line. For example, the transmission line branches can have a length that is a multiple of a half period of the predefined wavelength of the clock signal (e.g., $\lambda/2$). Therefore, every two clock distribution networks can be separated from each other by an integer multiple of the wavelength $\lambda$ of the clock signal. Through the appropriate choice of lengths of the main transmission line and the transmission line branches, the clock signal can be delivered with uniform phase and amplitude to each of the several clock distribution networks at the zeroth-order mode. Through the appropriate choice of impedance of the main transmission line and the transmission line branches, the effect of higher-order frequency modes can be mitigated, thus maintaining the uniformity of the clock signal provided to each of the circuit(s) that are provided the clock signal by the clock distribution resonator system.

FIG. 1 illustrates an example diagram of a clock distribution resonator system 10. The clock distribution resonator system 10 can be implemented in a variety of applications, such as in a reciprocal quantum logic (RQL) circuit design. For example, the clock distribution resonator system 10 can be implemented in or as part of an integrated circuit (IC) chip, a printed circuit board (PCB), or across multiple IC chips and/or PCBs.

The clock distribution resonator system 10 includes a clock source 12. The clock source 12 can be configured to generate a clock signal CLK, such as a sinusoidal clock signal, at a predetermined frequency (e.g., 1-20 GHz). As an example, the clock source 12 can be configured as any of a variety of oscillators configured to provide a stable frequency reference to each of a respective one or more circuits 14 that may be distributed across the IC chip(s) and/or PCB(s) in which the clock distribution resonator system 10 is implemented, as described herein. In the example of FIG. 1, the clock source 12 is coupled to a main transmission line 16 that is configured to propagate the clock signal CLK to a plurality of transmission line branches 18. The transmission line branches 18 can branch off of the main transmission line 16, such as to form a dendritic arrangement of the main transmission line 16 and the transmission line branches 18. As described herein, the dendritic arrangement can include multiple layers, such that each of a first portion of the transmission line branches 18 in a given layer can branch off into separate sets of transmission line branches 18 in a next layer, and so on.

As an example, the main transmission line 16 can have a predetermined length that is associated with the predefined wavelength $\lambda$ of the clock signal CLK. For example, the main transmission line 16 can have a length that is an odd multiple of a quarter period of the predefined wavelength $\lambda$ of the clock signal CLK (e.g., $\lambda/4$, $3\lambda/4$, $5\lambda/4$, etc.). As a result, the clock signal CLK can be provided at the end of the main transmission line 16 at an anti-node that can provide the greatest amplitude of the clock signal CLK to the transmission line branches 18. As another example, each of the transmission line branches 18 that branch from the main transmission line 16 can likewise have a predetermined length that is associated with the predefined wavelength $\lambda$ of the clock signal CLK, with the length of the transmission line branches 18 being different from the length of the main transmission line 16. For example, the transmission line branches 18 can have a length that is a multiple of a half period of the predefined wavelength $\lambda$ of the clock signal CLK (e.g., $\lambda/2$, $\lambda$, $3\lambda/2$, a, etc.). For example, each of the transmission line branches 18 in each of the layers of the dendritic arrangement can have the same predefined length. Therefore, each end of each of the transmission line branches 18 can be associated with the anti-node of the clock signal CLK, and can thus provide the maximum amplitude at a distal end relative to the main transmission line 16.

In the example of FIG. 1, the transmission line branches 18 provide the clock signal CLK to each of a plurality of clock distribution networks 20. As described herein, the term "clock distribution network" corresponds to a circuit or physical resonator arrangement that is configured to provide the clock signal CLK to one of the circuit(s) 14. As an example, the clock distribution networks 20 can each correspond to dynamic zeroth-order resonators ("DynaZORs") that implement a resonator "spine" and "rib" configuration. Therefore, each of the clock distribution networks 20 can be implemented in a superconducting environment, such as to inductively couple the clock signal CLK to the associated circuit(s) 14. The clock distribution networks 20 can be associated with each of the transmission line branches 18 in a lowest level of a dendritic arrangement, for example. Additionally, because the transmission line branches 18 can have a length that is a multiple of a half period of the predefined wavelength $\lambda$ of the clock signal CLK, every two clock distribution networks can be separated from each other by an integer multiple of the wavelength $\lambda$ of the clock signal CLK. Accordingly, through the appropriate choice of lengths of the main transmission line 16 and the transmission line branches 18, the clock signal CLK can be delivered with uniform phase and amplitude to each of the several clock distribution networks 20 at the zeroth-order mode. Additionally, through the appropriate choice of impedance of the main transmission line 16 and the transmission line branches 18, the effect of higher-order frequency modes can be mitigated, thus maintaining the uniformity of the clock signal CLK provided to each of the circuit(s) 14 that are provided the clock signal CLK by the clock distribution resonator system 10.

Figure 2:
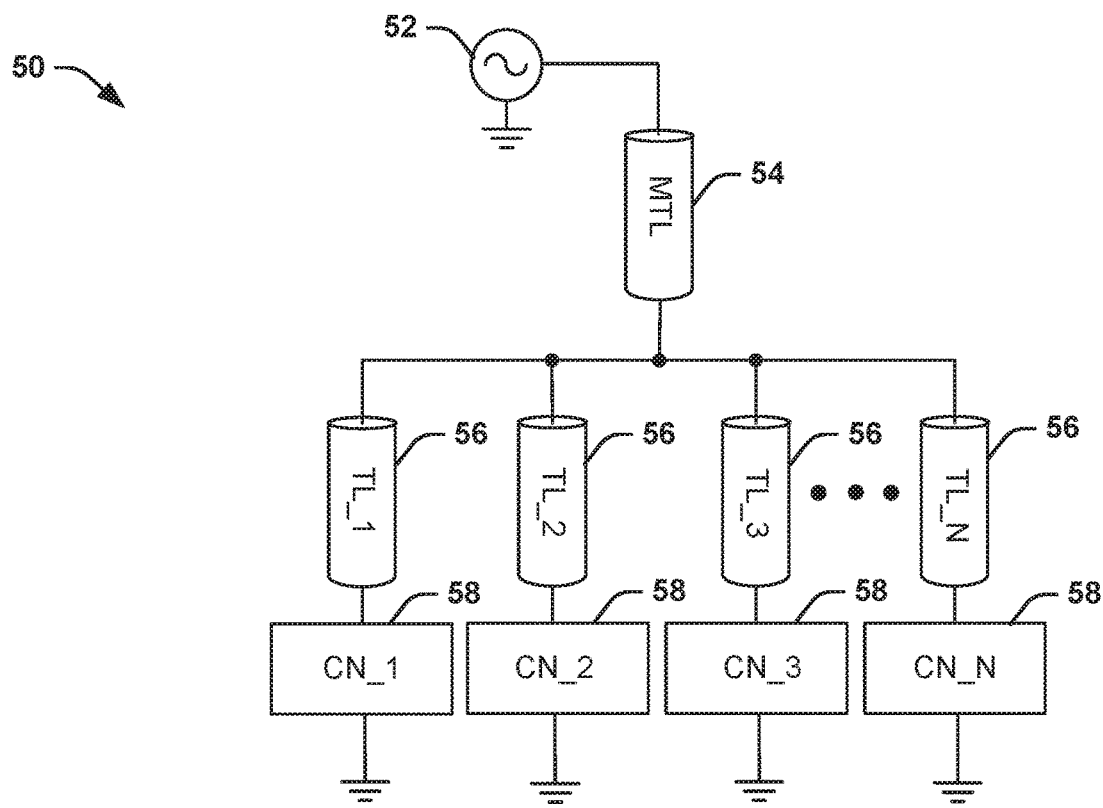
FIG. 2 illustrates an example of a clock distribution resonator system.

FIG. 2 illustrates an example of a clock distribution resonator system 50. The clock distribution resonator system 50 can correspond to the clock distribution resonator system 10 in the example of FIG. 1. Therefore, reference is to be made to the example of FIG. 1 in the following description of the example of FIG. 2. Similar to as described previously, the clock distribution resonator system 50 can be implemented in a variety of applications to provide the clock signal CLK to a variety of different circuits that can be distributed across an IC chip, a PCB, or across multiple IC chips and/or PCBs.

The clock distribution resonator system 50 includes a clock source 52 configured to generate the clock signal CLK, such as a sinusoidal clock signal, at a predetermined frequency (e.g., ten or more GHz). The clock source 52 is coupled to a main transmission line 54 that is configured to propagate the clock signal CLK to a plurality N of transmission line branches 56, demonstrated as "TL_1" to "TL_N", where N is a positive integer greater than one. In the example of FIG. 2, the main transmission line 54 and the transmission line branches 56 are configured in a dendritic arrangement, such that the transmission line branches 56 branch off of the main transmission line 54 to provide the clock signal CLK to each of a respective plurality N of clock distribution networks 58, demonstrated as "CN_1" to "CN_N". Therefore, the clock distribution networks 58 are configured to provide the clock signal CLK to each of one or more associated circuits (not shown in the example of FIG. 2) to provide timing and other functions to the respective circuit(s). As described herein, based on the arrangement of the clock distribution resonator system 50, the clock signal CLK can be provided in a uniform and synchronized manner to each of the circuit(s).

As an example, the main transmission line 54 can have a predetermined length that is associated with the predefined wavelength λ of the clock signal CLK. For example, the main transmission line 54 can have a length that is an odd multiple of a quarter period of the predefined wavelength λ of the clock signal CLK (e.g., λ/4, 3λ/4, 5λ/4, etc.). As a result, the clock signal CLK can be provided at the end of the main transmission line 54 at an anti-node that can provide the greatest amplitude of the clock signal CLK to the transmission line branches 56. Additionally, because the main transmission line 54 can have a length that is an odd multiple of a quarter period of the predefined wavelength λ of the clock signal CLK, the main transmission line 54 provides a significantly high impedance from the clock distribution networks 58 to the clock source 52.

As another example, each of the transmission line branches 56 that branch from the main transmission line 54 can likewise have a predetermined length that is associated with the predefined wavelength λ of the clock signal CLK, with the length of the transmission line branches 56 being different from the length of the main transmission line 54. For example, the transmission line branches 56 can have a length that is a multiple of a half period of the predefined wavelength λ of the clock signal CLK (e.g., λ/2, λ, 3λ/2, a, etc.). For example, each of the transmission line branches 56 in each of the layers of the dendritic arrangement can have the same predefined length. Therefore, each end of each of the transmission line branches 56 can be associated with the anti-node of the clock signal CLK, and can thus provide the maximum amplitude at a distal end relative to the main transmission line 54.

Similar to as described previously, the clock distribution networks 58 can each correspond to DynaZORs that implement a resonator "spine" and "rib" configuration. Therefore, each of the clock distribution networks 58 can be implemented in a superconducting environment, such as to inductively couple the clock signal CLK to the associated circuit(s). As described previously, because the transmission line branches 56 can have a length that is a multiple of a half period of the predefined wavelength λ of the clock signal CLK, every two clock distribution networks can be separated from each other by an integer multiple of the wavelength λ of the clock signal CLK. As a result, the impedance between each of the clock distribution networks 58 can be substantially mitigated, such as to provide an impedance of less than or equal to approximately 50Ω between each of the clock distribution networks 58. Accordingly, through the appropriate choice of lengths of the main transmission line 54 and the transmission line branches 56, the clock signal CLK can be delivered with uniform phase and amplitude to each of the several clock distribution networks 58 at the zeroth-order mode. Additionally, through the appropriate choice of impedance of the main transmission line 54 and the transmission line branches 56, the effect of higher-order frequency modes can be mitigated, thus maintaining the uniformity of the clock signal CLK provided to each of the circuit(s) that are provided the clock signal CLK by the clock distribution resonator system 50. Additionally, the clock distribution resonator system 50 is implemented as a passive circuit, with no active components, which can thus render the clock distribution resonator system 50 suitable for implementation in a superconducting circuit.

Figure 3:
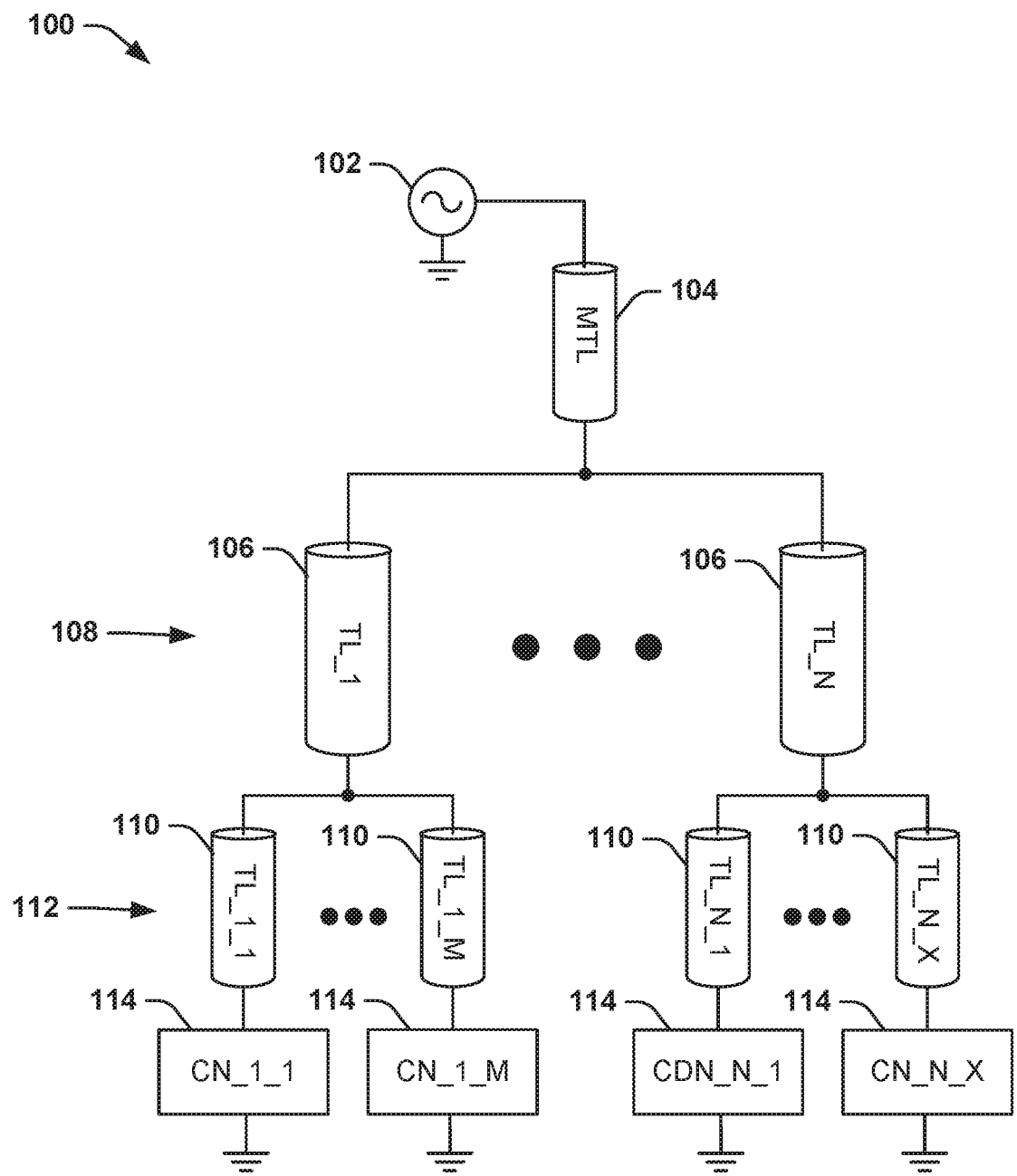
FIG. 3 illustrates another example of a clock distribution resonator system.

FIG. 3 illustrates an example of a clock distribution resonator system 100. The clock distribution resonator system 100 can correspond to the clock distribution resonator system 10 in the example of FIG. 1. Therefore, reference is to be made to the example of FIG. 1 in the following description of the example of FIG. 3. Similar to as described previously, the clock distribution resonator system 100 can be implemented in a variety of applications to provide the clock signal CLK to a variety of different circuits that can be distributed across an IC chip, a PCB, or across multiple IC chips and/or PCBs. The clock distribution resonator system 100 demonstrates an example of the dendritic arrangement of the clock distribution resonator system 100 in multiple layers of the transmission line branches.

The clock distribution resonator system 100 includes a clock source 102 configured to generate the clock signal CLK, such as a sinusoidal clock signal, at a predetermined frequency (e.g., ten or more GHz). The clock source 102 is coupled to a main transmission line 104 that is configured to propagate the clock signal CLK to a plurality N of first transmission line branches 106, demonstrated as "TL_1" to "TL_N", where N is a positive integer greater than one. The first transmission line branches 106 are arranged in a first layer, demonstrated in the example of FIG. 3 at 108. Therefore, the transmission line branches 106 branch off of the main transmission line 104 to provide the clock signal CLK to each of a respective plurality of sets of second transmission line branches 110. The second transmission line branches 110 are arranged in a second layer, demonstrated in the example of FIG. 3 at 112.

In the example of FIG. 3, each of the sets of second transmission line branches 110 can have a quantity that is the same or distinct with respect to each of the first transmission line branches 106 from which the clock signal CLK is provided. In the example of FIG. 3, a first set of the second transmission line branches 110, provided from the first transmission line "TL_1", has a quantity M of second transmission line branches 110, demonstrated as "TL_1_1" to "TL_1_M". Similarly, a last set of the second transmission line branches 110, provided from the Nth transmission line "TL_N", has a quantity X of second transmission line branches 110, demonstrated as "TL_1_1" to "TL_1_X". Therefore, the quantity M and X, as well as the quantity of any of the sets of second transmission line branches 110 between the first and Nth of the first transmission lines 106, can have the same or different quantities of second transmission lines 110 in a given set.

Each of the second transmission line branches 110 is configured to provide the clock signal CLK to each of a respective one of clock distribution networks 114. The clock distribution networks 114 can each be associated with a respective one of the second transmission line branches 110 in the second layer 112, such that the clock distribution resonator system 100 includes X clock distribution networks 114 that are provided the clock signal CLK from the first of the first transmission line branches 104 and includes Y clock distribution networks 114 that are provided the clock signal CLK from the Nth of the first transmission line branches 104. Therefore, the clock distribution networks 114 are configured to provide the clock signal CLK to each of one or more associated circuits (not shown in the example of FIG. 3) to provide timing and other functions to the respective circuit(s). As described herein, based on the arrangement of the clock distribution resonator system 100, the clock signal CLK can be provided in a uniform and synchronized manner to each of the circuit(s).

Similar to as described previously, the main transmission line 104 can have a predetermined length that is an odd multiple of a quarter period of the predefined wavelength λ of the clock signal CLK. As a result, the clock signal CLK can be provided at the end of the main transmission line 104 at an anti-node that can provide the greatest amplitude of the clock signal CLK to the transmission line branches 106. Similar to as also described previously, each of the first and second transmission line branches 106 and 110 can have a length that is a multiple of a half period of the predefined wavelength λ of the clock signal CLK. The first transmission line branches 106 and the second transmission line branches 110 can all have the same predetermined length, but are not limited to having the same predetermined length with respect to the first and second transmission line branches 106 and 110 associated with the respective first and second rows 108 and 112.

Accordingly, because the main transmission line 104 can have a length that is an odd multiple of a quarter period of the predefined wavelength λ of the clock signal CLK, the main transmission line 104 provides a significantly high impedance from the clock distribution networks 114 to the clock source 102. Also accordingly, each end of each of the transmission line branches 106 can be associated with the anti-node of the clock signal CLK, and can thus provide the maximum amplitude to the clock distribution networks 114. Similar to as described previously, the clock distribution networks 114 can each correspond to DynaZORs that implement a resonator "spine" and "rib" configuration. Therefore, each of the clock distribution networks 108 can be implemented in a superconducting environment, such as to inductively couple the clock signal CLK to the associated circuit(s). While the clock distribution resonator system 100 demonstrates only two rows 108 and 112 of the dendritic arrangement of the transmission line branches 108 and 112, it is to be understood that there can be additional rows interconnecting the main transmission line 104 and the clock distribution networks 114. For example, each of the second transmission line branches 110 can have another set of third transmission line branches that interconnect the second transmission line branches 110 and the clock distribution networks 114, in a third or more rows. By maintaining the predetermined lengths of the transmission line branches, and by maintaining a substantially low impedance for operation in a superconducting environment, the clock distribution resonator system 100 can be arranged in a large plurality of rows of transmission line branches to provide the clock signal CLK to a large plurality of clock distribution networks 114, and thus associated circuit(s) that are distributed across a large IC chip, multiple IC chips, and/or across one or more PCBs. Accordingly, the clock distribution resonator system 100 can be arranged in any of a variety of ways.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A clock distribution resonator system comprising:
   a clock source configured to generate a clock signal having a predefined wavelength;
   a main transmission line coupled to the clock source to propagate the clock signal and comprising a first predetermined length defined as a function of the wavelength of the clock signal;
   a plurality of transmission line branches each coupled to the main transmission line to propagate the clock signal, each of the plurality of transmission line branches comprising a second predetermined length defined as a function of the wavelength of the clock signal, the second predetermined length being different from the first predetermined length; and
   a plurality of clock distribution networks coupled to the respective plurality of transmission line branches, each of the plurality of clock distribution networks comprising a plurality of parallel standing wave resonators, a plurality of circuits being coupled to each of the plurality of parallel standing wave resonators, the plurality of clock distribution networks being configured to provide the clock signal to each of the plurality of circuits to provide clock synchronization for the associated plurality of circuits.

2. The system of claim 1, wherein the clock signal is a sinusoidal clock signal.

3. The system of claim 1, wherein the first predetermined length is an odd multiple of a quarter period of the predefined wavelength of the clock signal.

4. The system of claim 1, wherein the second predetermined length is a multiple of a half period of the predefined wavelength of the clock signal.

5. The system of claim 1, wherein each of the plurality of clock distribution networks is separated from each of the other plurality of clock distribution networks via the plurality of transmission line branches by an integer multiple of the predefined wavelength.

6. The system of claim 1, wherein the main transmission line and the plurality of transmission line branches are arranged to have a total impedance between the clock source and each of the clock distribution network of approximately 50Ω or less.

7. The system of claim 1, wherein the plurality of transmission line branches is a plurality of first transmission line branches, the system further comprising a plurality of sets of second transmission line branches, each of the plurality of sets of second transmission line branches being coupled to one of the plurality of first transmission line branches, wherein each of the plurality of clock distribution networks is coupled to a transmission line branch associated with a respective one of the plurality of sets of second transmission line branches to form a dendritic network of transmission line branches.

8. The system of claim 6, wherein each of the plurality of first transmission line branches and each transmission line branch of each of the plurality of sets of second transmission line branches comprises the second predetermined length.

9. The system of claim 1, wherein a first portion of the plurality of circuits are arranged on a first integrated circuit (IC) chip, and wherein a second portion of the plurality of circuits are arranged on a second IC chip.

10. The system of claim 1, wherein a first portion of the plurality of circuits are arranged on a first printed circuit board (PCB), and wherein a second portion of the plurality of circuits are arranged on a second PCB.

11. The system of claim 1, wherein each of the clock distribution networks is arranged as a dynamic zeroth-order resonator (DynaZOR) configured to couple the clock signal to each of the respective plurality of circuits.

12. A clock distribution resonator system comprising:
a clock source configured to generate a sinusoidal clock signal having a predefined wavelength;
a main transmission line coupled to the clock source to propagate the sinusoidal clock signal and comprising a length defined as an odd multiple of a quarter period of the predefined wavelength of the sinusoidal clock signal;
a plurality of transmission line branches each coupled to the main transmission line to propagate the sinusoidal clock signal, each of the plurality of transmission line branches comprising a length defined as a multiple of a half period of the predefined wavelength of the sinusoidal clock signal; and
a plurality of clock distribution networks coupled to the respective plurality of transmission line branches, each of the plurality of clock distribution networks comprising a plurality of parallel standing wave resonators, a plurality of circuits being coupled to each of the plurality of parallel standing wave resonators, the plurality of clock distribution networks being configured to provide the sinusoidal clock signal to each of the plurality of circuits to provide clock synchronization for the associated plurality of circuits.

13. The system of claim 12, wherein the main transmission line and the plurality of transmission line branches are arranged to have a total impedance between the clock source and each of the clock distribution network of approximately 50Ω or less.

14. The system of claim 12, wherein the plurality of transmission line branches is a plurality of first transmission line branches, the system further comprising a plurality of sets of second transmission line branches, each of the plurality of sets of second transmission line branches being coupled to one of the plurality of first transmission line branches, wherein each of the plurality of clock distribution networks is coupled to a transmission line branch associated with a respective one of the plurality of sets of second transmission line branches to form a dendritic network of transmission line branches.

15. The system of claim 12, wherein each of the clock distribution networks is arranged as a dynamic zeroth-order resonator (DynaZOR) configured to inductively couple the sinusoidal clock signal to each of the respective plurality of circuits.

16. A clock distribution resonator system comprising:
a clock source configured to generate a sinusoidal clock signal having a predefined wavelength;
a main transmission line coupled to the clock source to propagate the sinusoidal clock signal and comprising a first predetermined length defined as a function of the wavelength of the sinusoidal clock signal;
a plurality of transmission line branches each coupled to the main transmission line to propagate the sinusoidal clock signal, each of the plurality of transmission line branches comprising a second predetermined length defined as a function of the wavelength of the sinusoidal clock signal, the second predetermined length being different from the first predetermined length, the main transmission line and the plurality of transmission line branches being arranged to have a total impedance between the clock source and each of the clock distribution network of approximately 50Ω or less; and
a plurality of clock distribution networks coupled to the respective plurality of transmission line branches, each of the plurality of clock distribution networks comprising a plurality of parallel standing wave resonators, a plurality of circuits being coupled to each of the plurality of parallel standing wave resonators, the plurality of clock distribution networks being configured to provide the sinusoidal clock signal to each of the plurality of circuits to provide clock synchronization for the associated plurality of circuits.

17. The system of claim 16, wherein the first predetermined length is an odd multiple of a quarter period of the predefined wavelength of the sinusoidal clock signal.

18. The system of claim 16, wherein the second predetermined length is a multiple of a half period of the predefined wavelength of the sinusoidal clock signal.

19. The system of claim 16, wherein each of the plurality of clock distribution networks is separated from each of the other plurality of clock distribution networks via the plurality of transmission line branches by an integer multiple of the predefined wavelength.

20. The system of claim 16, wherein each of the clock distribution networks is arranged as a dynamic zeroth-order resonator (DynaZOR) configured to couple the clock signal to each of the respective plurality of circuits.

21. The system of claim 1, wherein each of the plurality of circuits are inductively coupled to at least one portion of a respective one of the plurality of parallel standing wave resonators.

* * * * *